(12) United States Patent
Shimbo

(10) Patent No.: US 6,839,440 B1
(45) Date of Patent: Jan. 4, 2005

(54) METHOD FOR CONTROLLING VOICE LEVEL AND LEVEL-CONTROLLING DEVICE

(75) Inventor: Atsushi Shimbo, Yokohama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/346,894

(22) Filed: Jul. 2, 1999

(30) Foreign Application Priority Data

Jul. 7, 1998 (JP) .......................................... 10-191752

(51) Int. Cl.⁷ ................................................ H03G 3/00
(52) U.S. Cl. ................... 381/107; 455/234.1; 455/63.1
(58) Field of Search .............................. 455/234.1, 219, 455/63.1, 67.13, 232.1; 381/104, 107, 106

(56) References Cited

U.S. PATENT DOCUMENTS 5,758,271 A * 5/1998 Rich ........................ 455/234.1

* cited by examiner

Primary Examiner—Minsun Oh Harvey
Assistant Examiner—Brian T. Pendleton
(74) Attorney, Agent, or Firm—Junichi Mimura

(57) ABSTRACT

The invention provides a method for controlling a level of a voice signal to reduce the noise which is superimposed on a voice signal without marring the content of the voice signal. To achieve the invention, the tracking signal is formed corresponding to a received RF signal strength. The tracking signal is reduced to together with the decrease of the received RF signal strength if the received RF signal strength decreases. The tracking signal increases at a constant rate gradually if the received RF signal strength increases. A level of a voice signal is controlled by a function corresponding to the tracking signal.

14 Claims, 12 Drawing Sheets

METHOD FOR CONTROLLING VOICE LEVEL AND LEVEL-CONTROLLING DEVICE

CROSS-REFERENCE TO RELATED APPLICATION

This application claims the priority benefit of Japanese Patent Application No. 10-191752, filed Jul. 7, 1998, the entire subject matter of which is incorporated herein by reference.

BACKGROUND OF THE INVENTION

1. Field of the Invention

The invention relates to a method for controlling a level of a voice signal, which is demodulated by a frequency modulation receiver, and a level-controlling device.

2. Description of the Related Art

The received RF(Radio Frequency) signal strength from a base station in a frequency modulation (FM) mode cellular phone fades intensively and dramatically in response to a change in the distance between the base station and the cellular phone or diffraction or reflection of radio wave by buildings. Noise added on a demodulated voice signal, is also fades intensively and dramatically in response to changes in the the received RF signal strength. As a result, the voice signal from the communicating party has a poor sound quality. Conventionally, a level-controlling circuit for a the voice signal in FM mode cellular phone controls the level of the voice signal in response to the received RF signal strength which is detected by a received RF signal strength detecting circuit. Concretely, The method utilized is that the level of the level of demodulate voice signal is attenuated by the received RF signal strength. For example, in a case that the received RF signal strength is weak, and high level of noise is superimposed on the voice signal, the voice signal and the noise are decayed.

However, in the conventional level-controlling circuit mentioned above, the level of the demodulated voice signal changes frequently in response to changes in the received RF signal strength. Therefore, the voice of the communicating party breaks up for short periods, or for long periods.

SUMMARY OF THE INVENTION

It is an object of the invention to provide a method for controlling a level of a voice signal to reduce noise superimposed on a voice signal, without marring a content of the voice signal.

BRIEF DESCRIPTION OF THE DRAWINGS

The invention will be more particularly described with reference to the accompanying drawings, in which.

DETAILED DESCRIPTION OF THE PREFERRED EMBODIMENT

Figure 2:
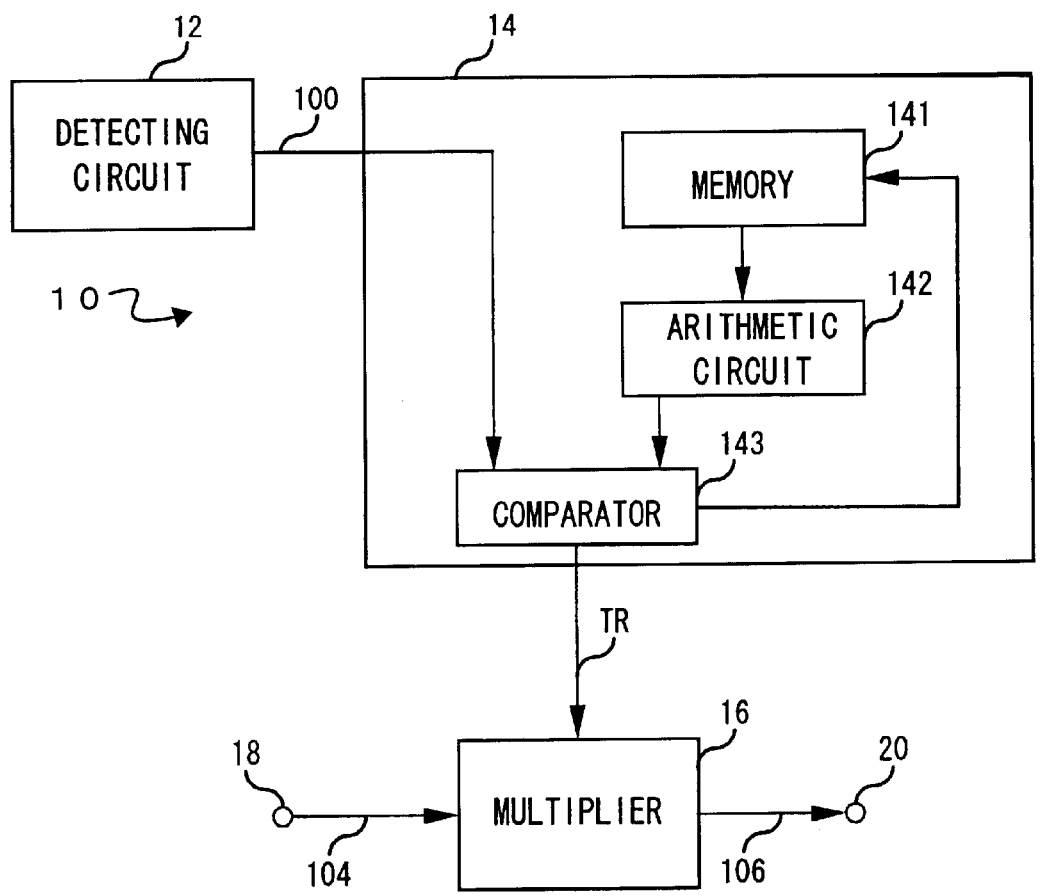
FIG. 2 is a block diagram of a level-controlling circuit for carrying out the first embodiment of the invention.

Referring to FIG. 2, a control circuit 10 has a detecting circuit 12 which detects received RF signal strength, a tracking circuit 14 and multiplier 16. The detecting circuit 12 outputs a detection signal 100 showing the received RF signal strength by detecting the received RF signtal strength. The detection signal 100 is input to the tracking circuit 14. It is possible to use other detecting circuits, such as a signal-to-noise (S/N) detecting circuit to detect an S/N ratio of the received RF signal or a noise detecting circuit to detect a noise which is added on a RF signal, instead of the detecting circuit 12.

The tracking circuit 14 outputs a tracking signal TR in response to the detection signal 100. The tracking circuit has a memory 141, an arithmetic circuit 142 and a comparator 143. An output from the comparator 143 is stored in the memory 141. A predetermined arithmetic explained later, is performed by the arithmetic circuit 142 with the data which is stored in the memory 141. The comparator 143 compares an output from the arithmetic circuit 142 to the detection signal 100, and outputs the tracking signal TR indicative of which of the signal 100 and the arithmetic circuit output signal, is smaller.

The tracking signal TR is stored in the memory 141, and also is output to one of input nodes of the multiplier 16. An input terminal 18 is connected to the other input node of the multiplier 16. A voice signal 104 which is demodulated by the FM receiver is input to the input terminal 18. The level of the voice signal 104 is multiplied by the level of the tracking signal TR in the multiplier 16, then the multiplier 16 outputs the result to an output terminal 10 as a voice signal 106. It is possible to use an alternative circuit which transforms a level of the voice signal 106 to a value proportional to the tracking signal TR, in stead of the multiplier 16.

Figure 1:
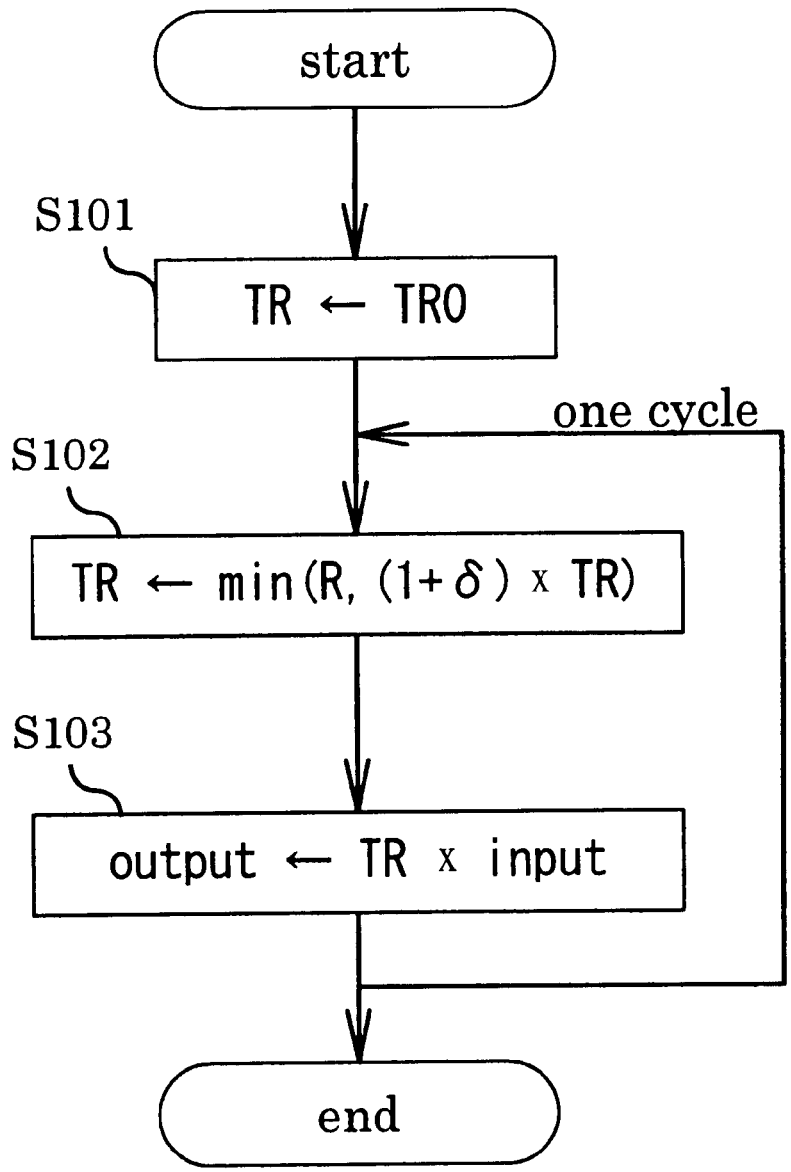
FIG. 1 is a flow chart a method for controlling a level of a voice signal, according to a first embodiment of the invention.

Each step shown in the flow chart in FIG. 1 is explained below with reference to the control circuit 10 shown in FIG. 2.

Figure 3:
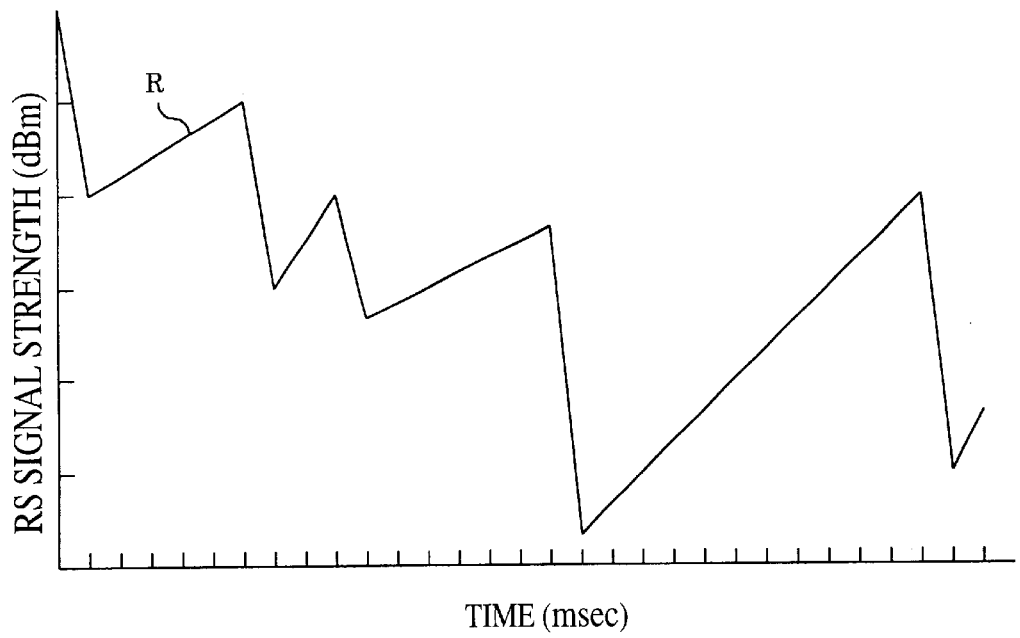
FIG. 3 is a graph showing one example of the relationship between time and received RF signal strength which is received by the receiver such as a cellular phone.

The received RF signal strength of the FM receiver which is loaded in a cellular phone or a car phone changes intensively a wide level range. Referring to FIG. 3, the received RF signal strength R of the received signal is measured along the vertical axis, and time is measured along the horizontal axis. The received RF signal strength R which is detected by the detecting circuit 12 is input to the tracking circuit 14 as the detection signal 100. Then, the tracking signal TR is formed every cycle T0 in response to the received RF signal strength R. The tracking signal is input to the multiplier 16. The level of the voice signal 104 from the input terminal 18 is multiplied by the level of the tracking signal TR in the multiplier 16; then the multiplier 16 outputs the result to the output terminal 20. The voice signal 106 is transformed in response to the tracking signal TR.

The initial value TR0 of the tracking signal TR is preset in the memory 141. A constant δ which has a very small value such as 0.01 is preset in the arithmetic circuit 142 (S 101 in FIG. 1). The initial value TR0 is greater than the maximum value of the received RF signal strength R.

The tracking signal TR (t) is found every cycle T0 by the following Equation (1):

$$TR(0)=TR0$$
$$TR(t)=\min(R(t), (1+\delta) \times TR(t-T0)) \quad (1)$$

where R(t) is the received RF signal strength R at the time t, and TR(t) is the tracking signal TR at the time t.

That is, the level of the tracking signal TR which is found by Equation (1) and which is stored in the memory 131 is multiplied by (1+δ) in arithmetic circuit 142. The comparator 143 compares (1+δ)×TR, which is the output from the arithmetic circuit 142, to the current received RF signal strength R then outputs which is smaller of these as the tracking signal TR to the multiplier 16 (S 102 in FIG. 1). The output from the comparator 143 is also stored in the memory 141; then it is used for forming a tracking signal TR after cycle T0. The level of the voice signal 104 is multiplied by the level of the tracking signal TR in the multiplier 16, then the multiplier 16 outputs the result to an output terminal 10 as a voice signal 106 (S 103 in FIG. 1).

Figure 4:
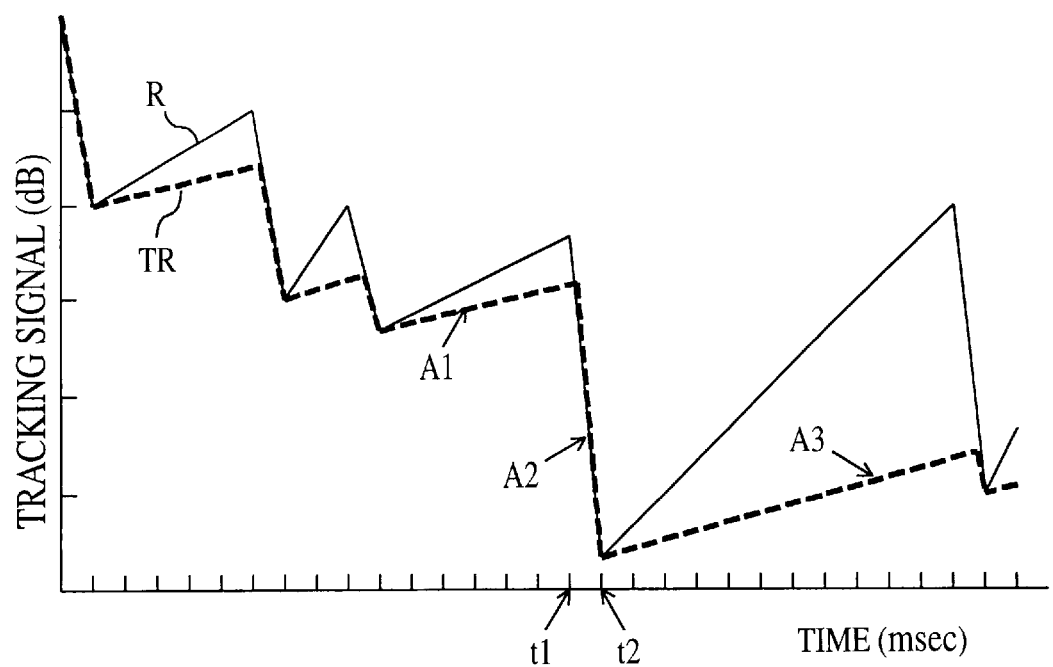
FIG. 4 is a graph showing a characteristic property of a tracking signal in the first embodiment the invention.

Referring to FIG. 4, the received RF signal strength R (dBm) is shown in solid line, and the level of the tracking signal TR (dB) is shown in broken line. The change of the tracking signal is explained below.

If the received RF signal strength R increases, the received RF signal strength R(t) is greater than the received RF signal strength R (t−T0). As the constant δ is very small, the received RF signal strength R(t) is greater than (1+δ)× TR(t−T0) (=(1+δ)×R(t−T0)). From Equation (1), (1+δ)×TR (t−T0) (=(1+δ)×R(t−T0)) is selected as the tracking signal TR(t).

After the cycle T0 is passed since the time t, the tracking signal TR (t+T0) can be found by Equation (1). As a result of the calculation, the tracking signal TR (t+T0) is (1+δ)× TR(t) (=(1+δ)×R(t)). Accordingly, if the received RF signal strength increases, the tracking signal TR which is found by Equation (1) increases at the rate δ gradually constantly. In FIG. 4, the tracking signals TR, which are increased gradually in certain periods with the constant rate δ, are shown as lines A1 and A3.

If the received RF signal strength decreases, the received RF signal strength R(t) is smaller than the received RF signal strength R (t−T0). As the constant δ is very small, the received RF signal strength R(t) is smaller than (1+δ)×TR (t−T0) (=(1+δ)×R(t−T0)). From Equation (1), R(t) is selected as the tracking signal TR(t).

After the cycle T0 is passed since the time t, the tracking signal TR (t+T0) can be found by Equation (1). As a result, R(t+T0) is selected as the tracking signal TR (t+T0). Accordingly, if the received RF signal strength decreases, the tracking signal TR which is found by Equation (1) is equal to the received RF signal strength R. In FIG. 4, the tracking signal TR decreasing together with the decrease of the received RF signal strength R in a certain period, is shown as a line A2

If the received RF signal strength R reaches a minimum value at the time t−T0, and then increases, the received RF signal strength R(t) is greater than the received RF signal strength R(t−T0) and the tracking signal TR (t−T0) is equal to the received RF signal strength R(t−T0). That is, as the received RF signal strength R(t) is greater than (1+δ)×TR (t−T0) (=(1+δ)×R(t−T0)), the tracking signal TR(t) is equal to (1+δ)×TR(t−T0). After that, as mentioned above, the tracking signal TR increases at the rate δ gradually and constantly. Referring to FIG. 4, the received RF signal strength R reaches a minimum value at the time t2, and then increases. The tracking signal TR which increases gradually after the time t2 in a certain period is shown as a line A3.

If the received RF signal strength R is changes to decreasing from increasing, the tracking signal TR increases at the rate δ gradually and constantly while the received RF signal strength R increases. If the received RF signal strength reaches a maximum value and then begins to decreasing, the tracking signal TR still increases at the rate δ constantly as long as the received RF signal strength R(t) remains greater than (1+δ)×TR(t−T0). When the received RF signal strength R(t) becomes smaller than (1+δ)×TR(t−T0), the tracking signal TR(t) becomes equal to the received RF signal strength R(t) in accordance with Equation (1). After that, the tracking signal TR decreases together with the decrease of the received RF signal strength R. In FIG. 4, the received RF signal strength is reached to the maximum value at time (t1), and then it decreases. The tracking signal TR decreases a little behind the decrease of the received RF signal strength R.

In the first embodiment mentioned above, as the track signal TR is reduced when the received RF signal strength R of the received signal is reduced, the noise superimposed on the voice signal 106 is reduced, because the level of the voice signal 104 is multiplied by the level of the tracking signal TR. Further, as the tracking signal is reduced quickly together with a rapid decrease of the received RF signal strength R, the noise superimposed on the voice signal 104 is also reduced quickly. Furthermore, since the tracking signal TR is gradually increased when the received RF signal strength increases, the level of the voice signal 106 smoothly increases without breaking it up. It is possible to use Equation (2) set forth below to determine the tracking signal TR. In this case, the output from the memory and the constant δ are added in the arithmetic circuit 142, and the result of the addition is then output from the arithmetic circuit 142.

$$TR(0)=TR0$$
$$TR(t)=\min(R(t), (TR+\delta)) \quad (2)$$

A second embodiment of the invention is explained below. Although the operations of an arithmetic circuit and a comparator of the second embodiment differ from the arithmetic circuit 142 and the comparator 143 of the first embodiment, the components of a level-controlling circuit carrying out the second embodiment of the invention are the same as those of the level-controlling circuit 10 for carrying out the first embodiment. Therefore, the same reference numbers are used for the explanation of the second embodiment.

Figure 5:
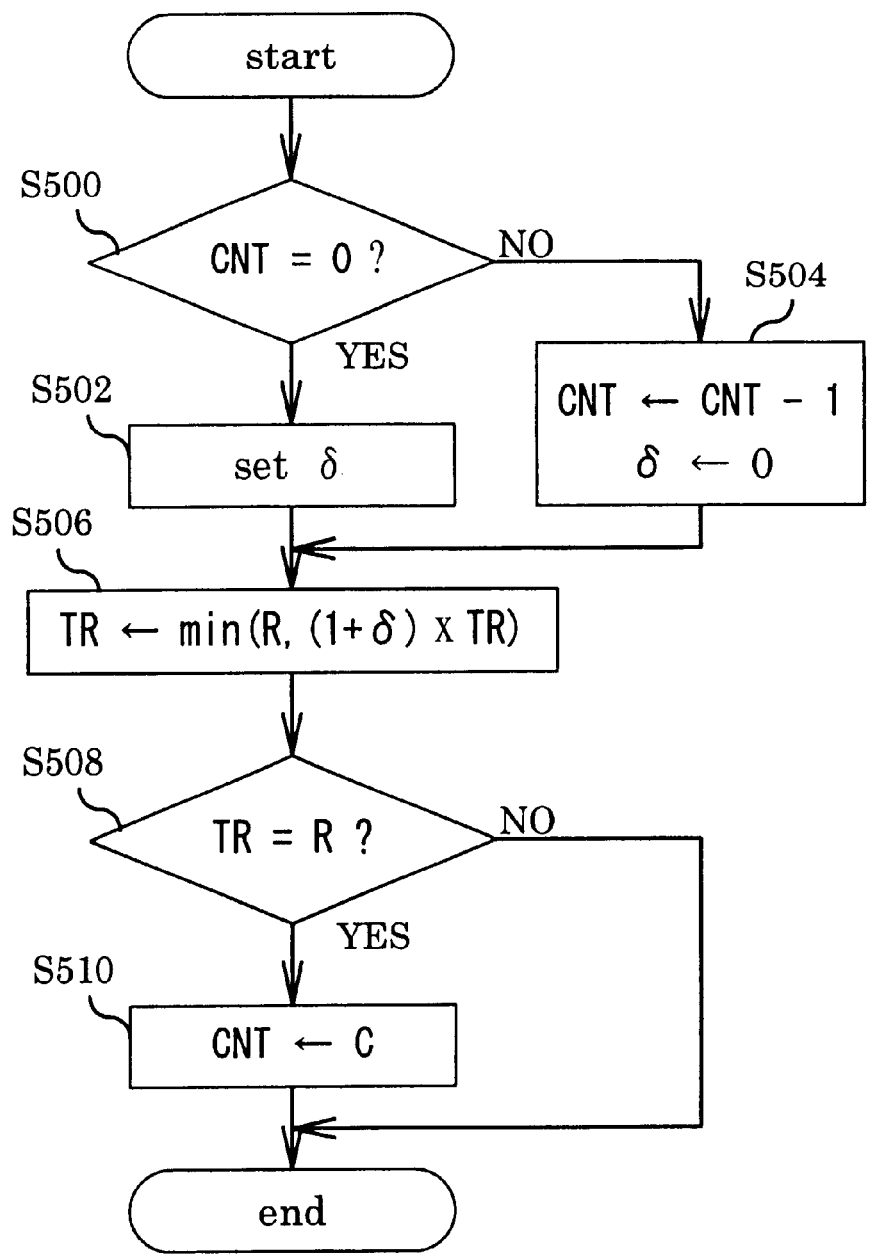
FIG. 5 is a flow chart for carrying out the second embodiment of the invention.

An initial value TR0 of a tracking signal TR is preset in a memory 141. The arithmetic circuit 142 has a counter CNT for counting a hang-over-period C. The tracking signal TR is kept at a predetermined value for the hang-over-period C to illuminate a jarring sound caused by small level-changes, and 5–8 msec is set to the hang-over-period C. An initial value of the counter CNT is set to zero. The initial value TR0 is set to a value which is greater than the maximum value of a received RF signal strength R. Referring to FIG. 5, the tracking signal TR can be found at the end of every cycle T0 by performing steps S500 through S510.

In step S500, the arithmetic circuit 142 judges whether the counter CNT indicates zero or not. If the counter CNT indicates zero, a constant δ in the arithmetic circuit 142 is set to a very small value such as 0.01 by the arithmetic circuit 142 (Step S502). If the counter CNT does not indicate zero, a constant δ is set to zero by decrementing the counter CNT(Step S504). This means that one cycle (T0) in the hang-over-period C has passed.

In step S506, the tracking signal TR(t) can be found by Equation (1). The level of the tracking signal TR(t−T0) stored in the memory 141 is multiplied by (1+δ) in the arithmetic circuit 142. In step S508, the comparator 143 compares (1+δ)×TR(t−T0) which is the output from the arithmetic circuit 142 with the received RF signal strength R(t), the tracking circuit 14 outputs the smaller of these as the tracking signal TR. The output from the comparator 143 is stored in the memory 141, and is then used for forming a tracking signal TR after the cycle T0. If the received RF signal strength R(t) is selected by the comparator 143, the counter CNT is reset to the hang-over-period C(Step S510).

Figure 6:
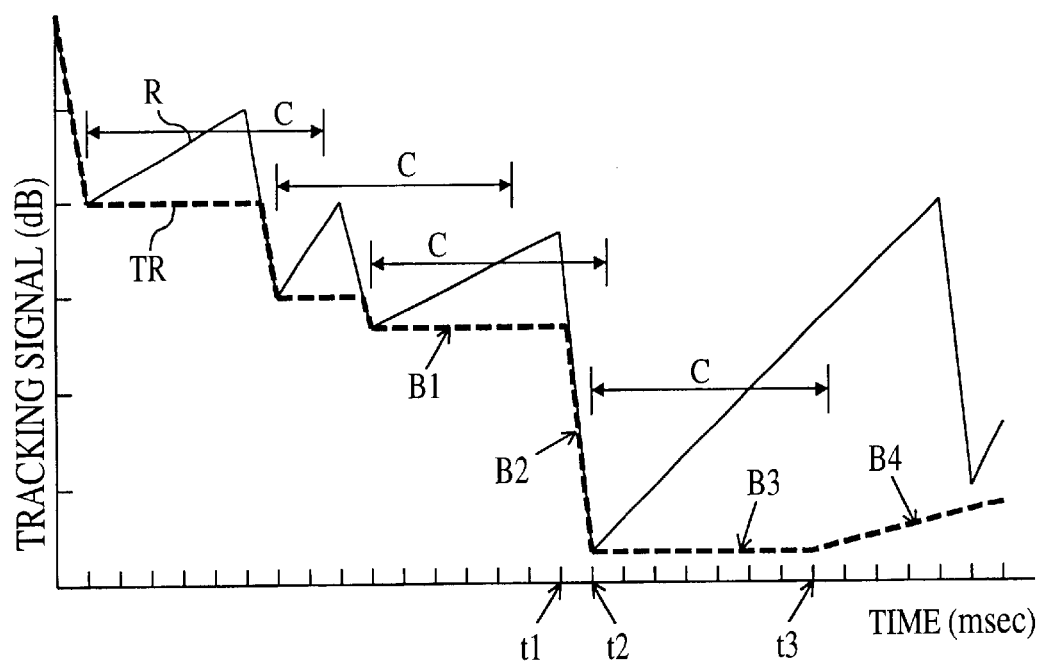
FIG. 6 is a graph showing a characteristic property of a tracking signal in the second embodiment of the invention.

Referring to FIG. 6, the received RF signal strength R(dBm) is shown in solid line, and the tracking signal TR (dB) is shown in broken line. The change of the tracking signal is explained below.

At the initial status, step S502 follows S500 because the counter CNT indicates zero. The constant δ is set to a predetermined value. In step S506, (1+δ)×TR(t−T0) is compared with R(t). After that, as the following relationship is carried out at the initial status, R(t) is selected.

$$(1+\delta) \times TR(t-T0) > R(t)$$

In step S508, as the tracking signal TR is equal to the received RF signal strength R, step S510 is performed after step S508. That is, the hang-over-period C is set in the counter.

After the cycle T0 has passed, the counter CNT is in the hang-over-period C, not zero in step S500. Therefore, the next step following step S500 is step 504. The counter CNT is decremented, and the constant δ is set to zero. In the next step S506, (1+δ)×TR(t) is equal to R(t). The different operation will be performed in the consequent steps by the variation of the received RF signal strength R.

If the received RF signal strength R increases, the received RF signal strength R(t+T0) is greater than the received RF signal strength R (t). Therefore, the received RF signal strength R (t+T0) is greater than the tracking signal TR (t) (=R(t)). Accordingly, the tracking signal TR (t) is selected as the tracking signal TR (t+T0) from Equation (1) (Step S506). Next, the tracking signal TR (t+T0) is compared with the received RF signal strength R (t+T0) in step S508. As they are not equal, step S 510 is not performed. As mentioned in step S504, the counter CNT is kept in the decremented status. After that, the operations of step S500 and steps S504 through S510 are repeatedly performed every cycle T0 being passed. The counter CNT decreases by one. During this period, the tracking signal TR is not changed. Referring to FIG. 6, the tracking signal TR which is not changed in the certain period is shown as a line B1.

After that, supposing the counter CNT becomes zero at the time (t3) by increasing the received RF signal strength R, step S502 is performed at the time (t3) and The constant δ is set to the predetermined value. In step S506, the tracking signal TR (t3) is found by Equation (1). The received RF signal strength R (t3) is greater than the tracking signal TR (t3−T0) at the time (t3−T0). Accordingly, the tracking signal TR (t3) becomes (1+δ)×TR(t3−T0). Next, the tracking signal TR (t3) is compared with the received RF signal strength R (t3) in step S508. As they are not equal, step S 510 is not performed. The counter CNT is kept in zero. After that, the operations of steps S500, S502, S506 and S508 are repeatedly performed every cycle T0 being passed. During this period, the tracking signal increases with at rate δ constantly. Referring to FIG. 6, the tracking signal TR which increases at constant rate δ gradually is shown as a line B4.

If the received RF signal strength decreases, the received RF signal strength R(t+T0) is smaller than the received RF signal strength R (t) and the tracking signal TR(t) is equal to the received RF signal strength R(t). Therefore, the tracking signal TR (t+T0) is equal to the received RF signal strength R (t+T0) from Equation (1). Next, the tracking signal TR (t+T0) is compared with the received RF signal strength R (t+T0) in step S508. As they are equal, step S 510 is performed, and then the counter is set in the hang-over-period C. After that, the operations of steps S500 and S504 and steps S506 through S510 are repeatedly performed every cycle T0 being passed. The tracking signal TR decreases together with the decrease of the received RF signal strength R. Referring to FIG. 6, the tracking signal TR which decreases together with the received RF signal strength R is shown as a line B2.

In the second embodiment mentioned above, as the track signal TR is reduced when the received RF signal strength R is reduced, the noise superimposed on the voice signal 106 is reduced because the level of the voice signal 104 is multiplied by the level of the tracking signal TR. Further, as the tracking signal is reduced quickly together with the rapid decrease of the received RF signal strength R, the noise superimposed on the voice signal 104 is reduced quickly. Furthermore, as the tracking signal TR increases gradually after the hang-over-period C has passed when the received RF signal strength is change to increase, the voice signal 106 is smoothly increased without breaking it. It is possible to use Equation (2) instead of Equation (1) in step S506 to get the same benefits.

The feature of the third embodiment is to add a step for forming a tracking signal which interpolates the differences between the first minimum value of the received RF signal strength and the next minimum value during the hang-over-period C, to the second embodiment.

Figure 7:
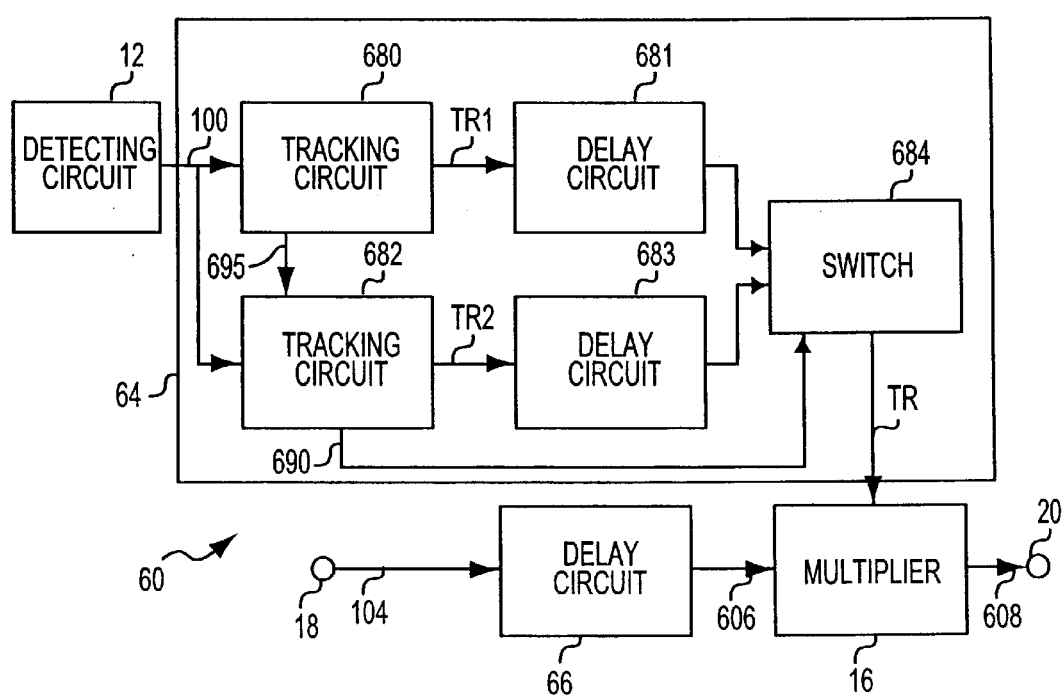
FIG. 7 is a block diagram of a level-controlling circuit for carrying out the third embodiment the invention.

Referring to FIG. 7, a level-controlling circuit 60 of the third embodiments has a detecting circuit 12, a multiplier 16, input terminal 18, a delay circuit 66 which is connected between the input terminal 18 and the multiplier 16, and a circuit 64 which is connected between the detecting circuit 12 and the multiplier 16. The detecting circuit 12 and the multiplier 16 in FIG. 2 are used for the third embodiment. The voice signal 104 from the input terminal 18 is delayed for the hang-over-period C by the delay circuit 66 to output.

The circuit 64 has a tracking circuit 680, a delay circuit 681, a tracking circuit 682, a storing circuit 683 and a switch 684. One of two outputs from the delay circuit 681 and form the storing circuit are selected by the switch 684, and then the selected output is input to the multiplier 16. If a control signal 609 from the tracking circuit 682 is zero, the output from the delay circuit 681 is input to the multiplier 16 as the tracking signal TR. If a control signal 609 from the tracking circuit 682 is one, the output from the storing circuit 683 is input to the multiplier 16 as the tracking signal TR.

Figure 8:
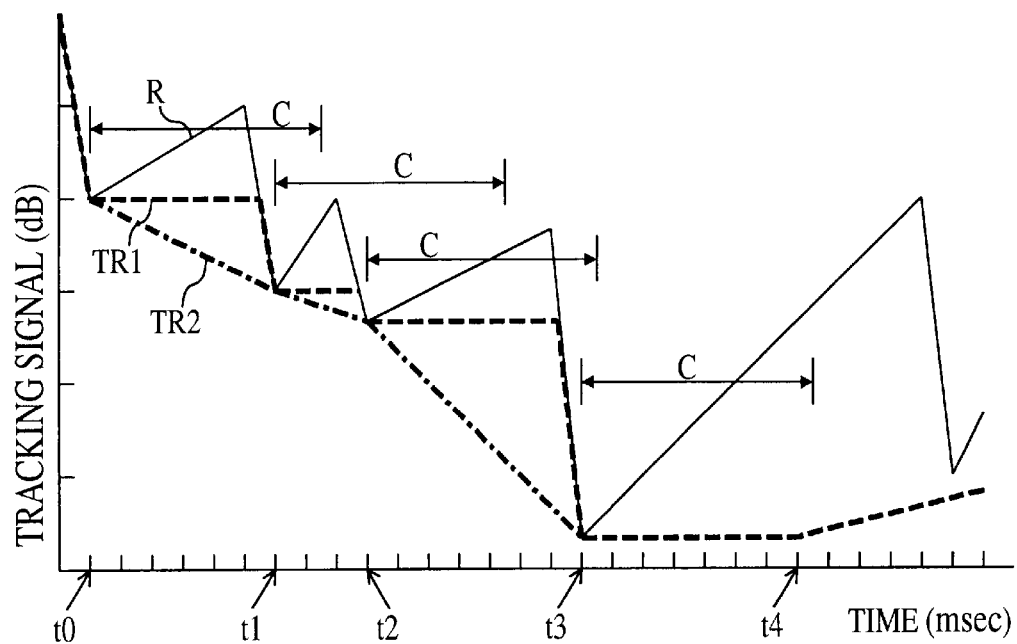
FIG. 8 is a graph showing a characteristic property of tracking circuits 680 and 682 in the third embodiment.

Referring to FIG. 8, the tracking signal TR1 which is shown in broken line is formed by the tracking circuit 680 when the detection signal 100 which shows the received RF signal strength R shown in solid line is input to the tracking circuit 680. The tracking signal TR1 is delayed for the hang-over-period C by the delay circuit 681, and then it is input to the switch 684. The tracking circuit 680 is the same as the tracking circuit mentioned in the second embodiment.

The tracking signal TR2 shown in a single dash line, which interpolates the differences between minimum values, is formed when the detection signal 100 which shows the received RF signal strength R shown in solid line is input to the tracking circuit 682. The tracking circuit 682 has a supplemental counter for counting the passing time from the time when the minimum value is detected. The predetermined pulse, which is synchronized with the cycle T0 of the tracking circuit 680, is counted by the supplement counter. The minimum value of the detection signal 100 is watched by the tracking circuit 682. The tracking circuit is restarted every detection of the minimum value of the detection signal 100 by resetting the supplemental counter.

Referring to FIG. 8, the operation of the tracking circuit 682 is explained below.

When the tracking circuit 682 detects that the received RF signal strength R (t2) is the minimum value, the tracking signal TR2 (t1) ... TR2 (t2) is calculated by Equation (3) mentioned below using the minimum value R (t) which is stored in the internal memory and a value N2 (=t2−t1) of the supplemental counter. The tracking signal TR2 (t1) ... TR2 (t2) is stored in the storing circuit 683. After the calculation is completed, the minimum value R (t1) which is stored in the memory of the tracking circuit 682 is replaced to the minimum value R (t2). These operations are competed before the next minimum value is detected.

$$R = R1 + (R2 - R1) \times n/N2 \quad (3)$$

$$(N = 0, 1, 2, \ldots, N2)$$

The tracking circuit 682 judges whether the value N2 of the supplemental counter is greater than the predetermined hang-over-period C or not. In this case, since the predetermined hang-over-period C is greater than the value N2, the control signal 690 from the tracking circuit 682 which is input to the switch 684 becomes one after the hang-over-period C has been passed from the time (t2). Then, the tracking signal TR2 (t1) ... TR2 (t2) which is stored in the storing circuit 683 is output from the switch 684 as the tracking signal TR, and it is input to the multiplier 16. Referring to FIG. 8, the tracking signal TR2 (t1) ... TR2 (t2) is shown in the single dash line. However, the tracking signal is delayed for the hang-over-period C, practically. The tracking signal TR2 (t2) ... TR2 (t3), which interpolates the difference between the minimum value R (t2) and the minimum value R (t3), is also formed.

In the case that the next minimum value is not detected after the hang-over-period C has been passed from the time when the minimum vale was detected, that is, the value of the supplemental counter becomes the hang-over-period C, the control signal 690 from the tracking circuit 682, which is input to the switch 684, is changed from one to zero. Then, the formation of the tracking signal TR2 is halted. The output from the delay circuit 681 is input to the multiplier 16 as the tracking signal TR through the switch 684.

A switching signal 695 is output to the tracking circuit 682 from the tracking circuit 680 when the tracking signal TR1 is changed from the signal which increases at the rate δ constantly to the signal which decreases together with the decrease of the received RF signal strength R. When the first minimum value of the received RF signal strength R is detected after receiving the switching signal, the tracking circuit 682 stores the its minimum value in the memory, and resets the supplemental counter. The supplemental counter restarts to count, and the tracking signal which interpolates the difference the minimum values is formed after that.

Figure 9:
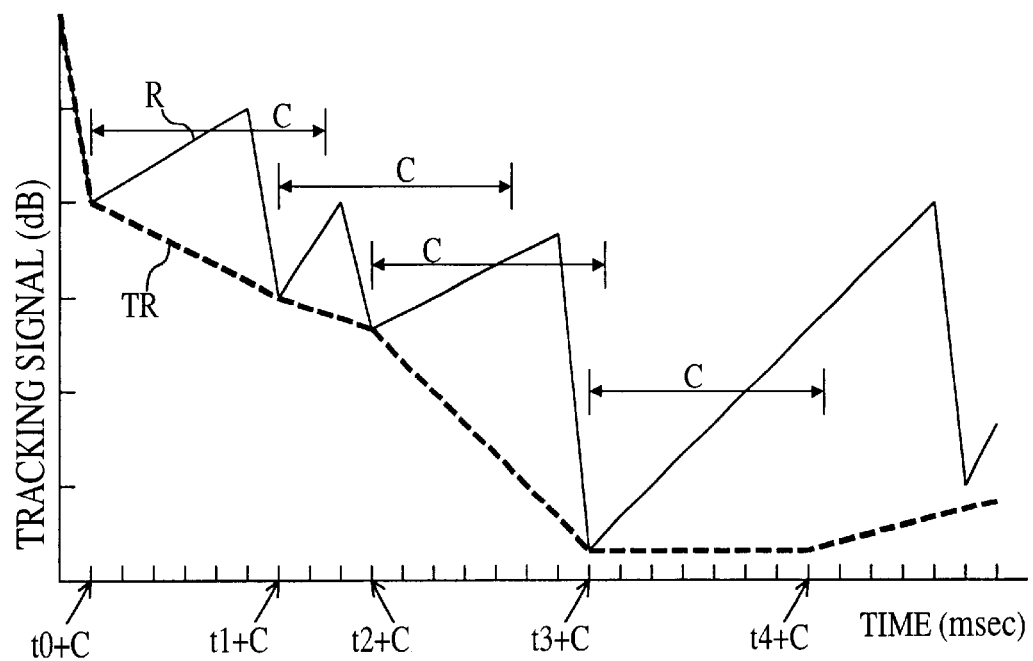
FIG. 9 is a graph showing a characteristic property of a tracking signal which is an output of a circuit 64 in the third embodiment.

Referring to FIG. 9, the tracking signal TR from the switch 684 is shown in the broken line. In this drawing, the received RF signal strength R is tilted to the right side with the hang-over-period C from the actual plots.

The voice signal 104 from the input terminal 18 is delayed for the hang-over-period C by the delay circuit 66. A phase of the voice signal 606 which is the output from the delay circuit 66 is identical to a phase of the tracking signal TR. The level of the voice signal 606 is multiplied by the level of the tracking signal TR in the multiplier 16, then the result of the multiplication is output to the output terminal 20 as the voice signal 608.

According to the third embodiment, the tracking signal is smoothly changed because the minimum value is interpolated between the minimum values. Therefore, the voice signal is smoothly changed.

Figure 10:
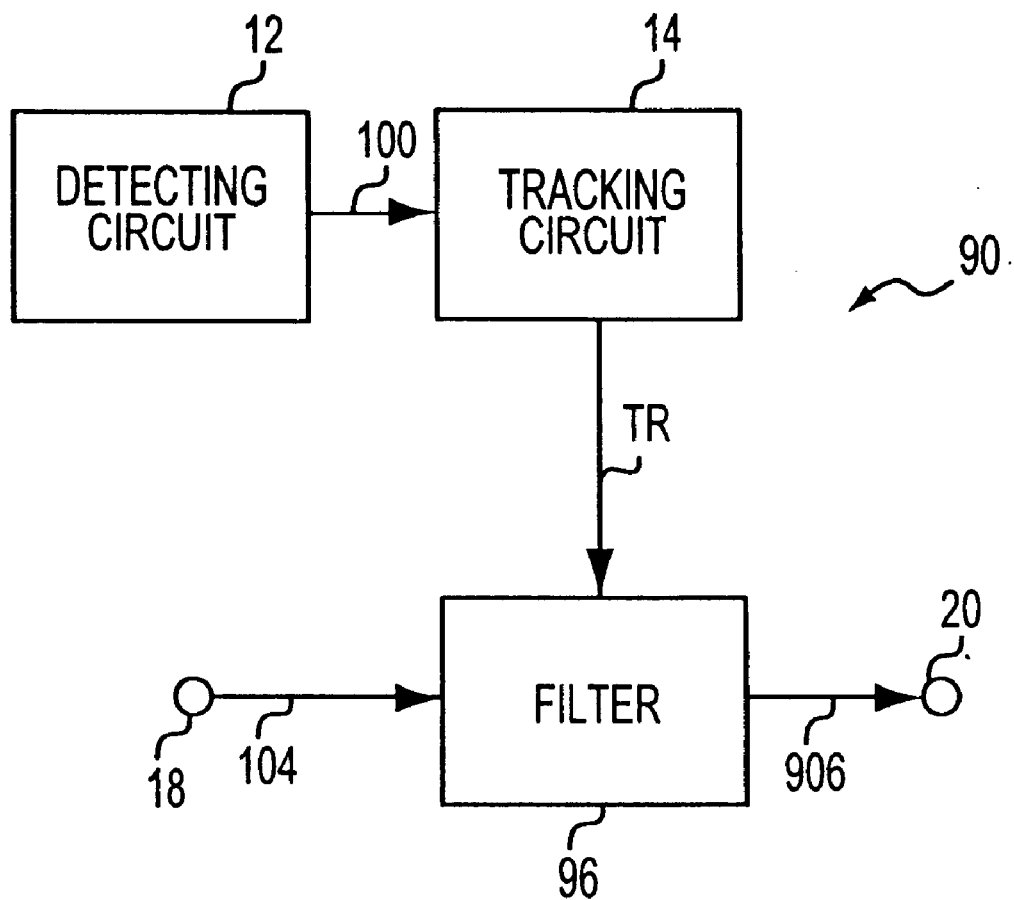
FIG. 10 is a block diagram of a level-controlling circuit for carrying out the fourth embodiment of the invention.

In the fourth embodiment, step for filtering the voice signal 104 is added instead of step S103 which is explained in the FIG. 1. Referring to FIG. 10, a level-controlling circuit 90 has a filter 96 instead of the multiplier 16 which is mentioned in FIG. 2. The detecting circuit 12 and the tracking circuit 14 are the same as what are used in the first and second embodiments. The filter 96 can control a gain and a passing band.

Figure 11:
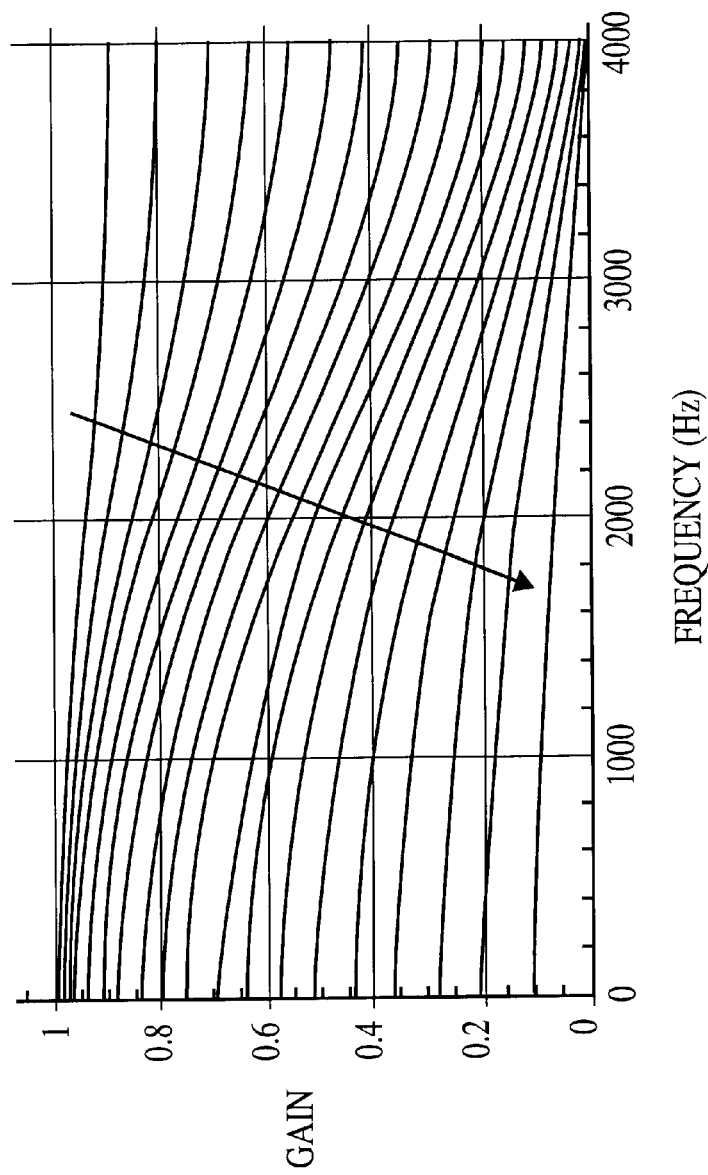
FIG. 11 is a graph showing the first example of a frequency characteristic of a filter 96 which is shown in FIG. 10.

Referring to FIG. 11, this frequency characteristic can be obtained by a linear infinite impulse response (IIR) low band passing filter. A transfer function H (z) is obtained by Equation (4)

$$H(z) = (1-\delta) \times (1-\delta \times z^{-1}) \quad (4)$$

$$(0 \leq \delta \leq 1)$$

The frequency characteristics of this filter is changed to the direction indicated by an arrow in consequence of the change of the coefficient σ from one to zero. The gain is fallen when the value of the coefficient σ is getting smaller. Specifically, the gain in the high band is dramatically fallen comparing to the gain in the low band. The noise of the high band constituent of the voice signal 104 can be reduced by controlling the coefficient σ following to the tracking signal TR.

Referring to FIG. 11, this frequency characteristic can be obtained by a quadratic IIR filter. A transfer function H (z) is obtained by Equation (5)

$$H(z) = \sigma^8 (1 - 1.764 \times \sigma^{-1} \times z^{-1} + 0.873 \times \sigma^{-2} \times z^{-2})/(1 - 1.764 \times z^{-1} + 0.837 \times z^{-2}) \quad (5)$$

$$(0 \leq \sigma \leq 1)$$

Figure 12:
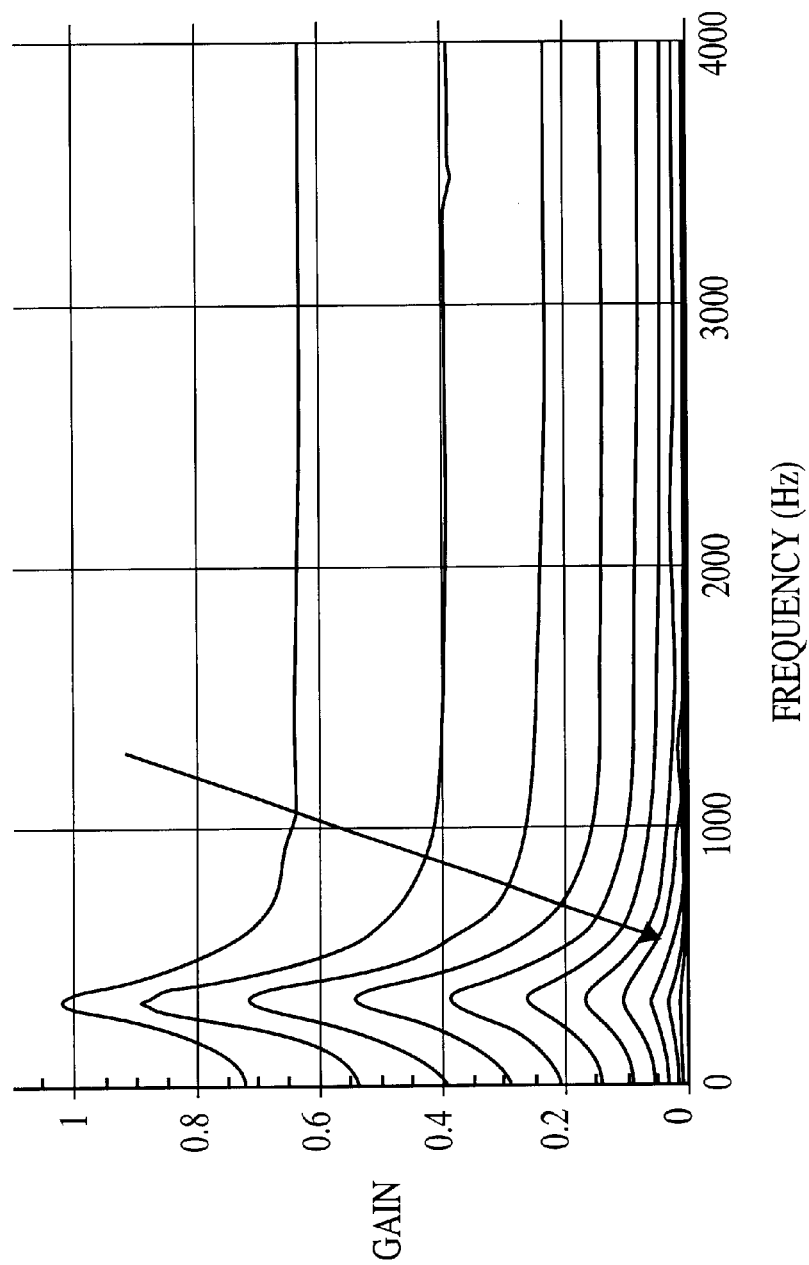
FIG. 12 is a graph showing the second example of a frequency characteristic of a filter 96 which is shown in FIG. 10.

The frequency characteristic of this filter resembles a spectrum of the voice signal. Specifically, the reduction ratio around 500 Hz in which plenty of the information is included is small, and the reduction ratio in the other band is large. The frequency characteristic of this filter is changed to the direction indicated by an arrow in FIG. 12 in consequence of the change of the coefficient σ from one to zero. The noise of the high band constituent of the voice signal 104 can be reduced by controlling the coefficient σ following to the tracking signal TR.

It is possible to use a finite impulse Response type filter as the filter 96 other than two filters mentioned above. It is also possible to use a combination of the IIR type filter and the FIR type filter to compose the filter 96. As the degree and the coefficient of the filter mentioned above is one of the examples to carry out the invention, it is further possible to use the combination of other degree and coefficient. It is furthermore possible to use the filter 96 mentioned in the fourth embodiment as the replacement of the multiplier 16 in the level-controlling circuit 60 in the third embodiment described in FIG. 7.

According to the invention, the level of the voice signal is controlled by the tracking signal which changes smoothly the deference between the minimum values of the received RF signal strength. Therefore, the level-controlling circuit of the invention has smooth noise reduction property. The level-controlling circuit is specifically used for the FM mode receiver such as FM mode cellular phone or a car FM receiver to obtain the benefit mentioned above.

While the invention has been described with reference to illustrative embodiments, this description is not intended to be construed in a limiting sense. Various modifications of the illustrated embodiments, as well as other embodiments of the invention, will be apparent to those skilled in the art on reference to this description. It is therefore contemplated that the appended claims will cover any such modifications or embodiments as fall within the true scope of the invention.

What I claim is:

1. A method for controlling a level of a voice signal, comprising the steps of, (a) setting a tracking signal at predetermined value;

(b) repeating following steps (c) through (e) every one cycle;

(c) transforming said tracking signal which is one cycle behind with a first function to form a first signal;

(d) comparing said first signal and a current received RF signal strength, and selecting one which is smaller as a current tracking signal; and (e) controlling a level of the voice signal by a second function corresponding to said current tracking signal, wherein said second function filters said voice signal with a filtering coefficient corresponding to said current tracking signal.

2. A method for controlling a level of a voice signal, comprising the steps of, (a) setting a tracking signal at a predetermined value;

(b) setting a counter to zero;

(c) repeating following steps (d) through (g) after each of a plurality of sequence cycles;

(d) forming a second signal by multiplying a level of said tracking signal which is one cycle behind by the constant ($\delta+1$) ($\delta$ is a positive number) if said counter is indicated to zero, or selecting said tracking signal which is one cycle behind as a second signal while decrementing said counter if said counter is not indicated to zero;

(e) setting said counter to a predetermined positive value if said second signal is greater than a current received RF signal strength;

(f) comparing said second signal and said current received RF signal strength, and selecting one which is smaller as a current tracking signal; and (g) controlling a level of the voice signal by a second function corresponding to said current tracking signal.

3. A method for controlling a level of a voice signal according to claim 2, wherein said second function multiplies a level of said voice signal by said current tracking signal.

4. A method for controlling a level of a voice signal according to claim 2, wherein said second function filters said voice signal with a filtering coefficient corresponding to said current tracking signal.

5. A method for controlling a level of a voice signal, comprising the steps of, (a) setting a tracking signal at a predetermined value;

(b) setting a counter to zero:

(c) repeating following steps (d) through (h) every one cycle;

(d) forming a second signal to multiply a level of said tracking signal which is one cycle behind by a constant ($\delta+1$) ($\delta$ is a positive number) if said counter is indicated to zero, or selecting said tracking signal which is one cycle behind as a second signal while decrementing said counter if said counter is not indicated to zero (e) forming a third signal to interpolate a deference between minimum values of a received RF signal strength;

(f) setting said counter to a second predetermined value if said second signal is greater then the current received RF signal strength;

(g) selecting said third signal as a current tracking signal if a time between said minimum values is shorter than said second predetermined value, or selecting said second signal as a current tracking signal if a time between said minimum values is longer than said second predetermined value; and (h) controlling a level of the voice signal by a second function corresponding to said current tracking signal.

6. A method for controlling a level of a voice signal according to claim 5, wherein said second function multiplies a level of said voice signal by said current tracking signal.

7. A method for controlling a level of a voice signal according to claim 5, wherein said second function filters said voice signal with a filtering coefficient corresponding to said current tracking signal.

8. A level-controlling device, comprising, a memory storing a value of a tracking signal;

a detector detecting a received RF signal strength;

a first arithmetic circuit transforming said value of said tracking signal which is stored in said memory with a first function;

a comparator comparing levels of output signals from said detector with said first arithmetic circuit, and selecting and outputting the smaller signal as a current tracking signal; and a second arithmetic circuit transforming an voice signal by a second function corresponding to said output from said comparator, wherein said second function filters said voice signal with a filtering coefficient corresponding to said value stored in said memory.

9. A level-controlling device, comprising:

a memory storing a value of a tracking signal;

a detector detecting a received RF signal strength;

a first arithmetic circuit transforming said value of said tracking signal which is stored in said memory with a first function;

a comparator comparing levels of output signals from said detector with said first arithmetic circuit, and selecting and outputting the smaller signal as a current tracking signal; and a second arithmetic circuit transforming an voice signal by a second function corresponding to said output from said comparator, a counter which is decremented every operation of the first arithmetic circuit, and is reset at a predetermined value when said output of said detector is selected by the comparator, wherein said first function multiply said value stored in said memory by a constant ($\delta+1$) ($\delta$ is a positive number) if said counter is indicated to zero, or said first function selects said value stored in said memory if said counter is not indicated to zero.

10. A level-controlling device, comprising:

a memory storing a value of a tracking signal;

a detector detecting a received RF signal strength;

a first arithmetic circuit transforming said value of said tracking signal which is stored in said memory with a first function;

a comparator comparing levels of output signals from said detector with said first arithmetic circuit, and selecting and outputting the smaller signal as a current tracking signal; and a second arithmetic circuit transforming an voice signal by a second function corresponding to said output from said comparator, a counter which is decremented every operation of the first arithmetic circuit, and is reset at a predetermined value when said output of said detector is selected by the comparator, wherein said first function adds said value stored in said memory and a constant ($\delta$) ($\delta$ is a positive number) if said counter is indicated to zero, or said first function selects said value stored in said memory if said counter is not indicated to zero.

11. A method for controlling a level of a voice signal, comprising the steps of, (a) setting a tracking signal at predetermined value;

(b) repeating following steps (c) through (e) every one cycle;

(c) transforming said tracking signal which is one cycle behind with a first function to form a first signal;

(d) comparing said first signal and a current received RF signal strength, and selecting one which is smaller as a current tracking signal; and (e) controlling a level of the voice signal by a second function corresponding to said current tracking signal, wherein said first function multiplies a level of said tracking signal which is behind with one cycle by a constant ($\delta+1$) ($\delta$ is a positive number).

12. A method for controlling a level of a voice signal, comprising the steps of, (a) setting a tracking signal at predetermined value;

(b) repeating following steps (c) through (e) every one cycle;

(c) transforming said tracking signal which is one cycle behind with a first function to form a first signal;

(d) comparing said first signal and a current received RF signal strength, and selecting one which is smaller as a current tracking signal; and (e) controlling a level of the voice signal by a second function corresponding to said current tracking signal, wherein said first function adds said tracking signal which is one cycle behind and a constant $\delta$ ($\delta$ is a positive number).

13. A level-controlling device, comprising, a memory storing a value of a tracking signal;

a detector detecting a received RF signal strength;

a first arithmetic circuit transforming said value of said tracking signal which is stored in said memory with a first function;

a comparator comparing levels of output signals from said detector with said first arithmetic circuit, and selecting and outputting the smaller signal as a current tracking signal; and a second arithmetic circuit transforming an voice signal by a second function corresponding to said output from said comparator, wherein said first function multiplies said value stored in said memory by a constant ($\delta+1$) ($\delta$ is a positive number).

14. A level-controlling device, comprising, a memory storing a value of a tracking signal;

a detector detecting a received RF signal strength;

a first arithmetic circuit transforming said value of said tracking signal which is stored in said memory with a first function;

a comparator comparing levels of output signals from said detector with said first arithmetic circuit, and selecting and outputting the smaller signal as a current tracking signal; and a second arithmetic circuit transforming an voice signal by a second function corresponding to said output from said comparator, wherein said first function adds said value stored in said memory by a constant ($\delta$) ($\delta$ is a positive number).

* * * * *